(12) United States Patent
Kim et al.

(10) Patent No.: US 9,406,906 B2
(45) Date of Patent: Aug. 2, 2016

(54) ENCAPSULATION SHEET, METHOD OF MANUFACTURING ORGANIC LIGHT EMITTING DISPLAY DEVICE USING THE SAME, AND ORGANIC LIGHT EMITTING DISPLAY DEVICE

(71) Applicant: Samsung Display Co., Ltd., Yongin, Gyeonggi-Do (KR)

(72) Inventors: Min-Soo Kim, Yongin (KR); Jin-Woo Park, Yongin (KR); Won-Sik Hyun, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/313,861

(22) Filed: Jun. 24, 2014

(65) Prior Publication Data

US 2014/0308487 A1    Oct. 16, 2014

Related U.S. Application Data

(62) Division of application No. 13/779,410, filed on Feb. 27, 2013, now Pat. No. 8,778,713.

(30) Foreign Application Priority Data

Aug. 28, 2012    (KR) .................. 10-2012-0094443

(51) Int. Cl.
*H01L 29/08*    (2006.01)
*H01L 51/52*    (2006.01)
*B32B 3/04*    (2006.01)

(52) U.S. Cl.
CPC .............. *H01L 51/5256* (2013.01); *B32B 3/04* (2013.01); *H01L 51/5253* (2013.01); *Y10T 428/23* (2015.01); *Y10T 428/24851* (2015.01)

(58) Field of Classification Search
USPC ............................................ 257/40, E51.022
See application file for complete search history.

(56) References Cited

U.S. PATENT DOCUMENTS

| | | |
|---|---|---|
| 2,642,633 A | 6/1953 | Dalton |
| 4,314,031 A | 2/1982 | Sanford et al. |
| 5,089,446 A | 2/1992 | Cornelius et al. |
| 7,615,506 B2 | 11/2009 | Aitken et al. |

(Continued)

FOREIGN PATENT DOCUMENTS

| | | |
|---|---|---|
| KR | 10-2005-0067364 A | 7/2005 |
| KR | 10-2005-0122302 A | 12/2005 |

(Continued)

OTHER PUBLICATIONS

Burrows et al., "Reliability and degradation of organic light emitting devices," *Appl. Phys. Lett.*, 1994, 65(23): 2922-2924.

(Continued)

*Primary Examiner* — Timor Karimy
(74) *Attorney, Agent, or Firm* — Knobbe Martens Olson & Bear LLP

(57) ABSTRACT

In one aspect, an encapsulation sheet, a method of manufacturing an organic light emitting display device using the encapsulation sheet, and an organic light emitting display device is provided. The encapsulation sheet includes a carrier film; and a first sheet formed on the carrier film, wherein the first sheet comprises at least one of tin fluorophosphates glass, chalcogenide glass, tellurite glass, borate glass, and phosphate glass.

4 Claims, 4 Drawing Sheets

(56) References Cited

U.S. PATENT DOCUMENTS

| | | | |
|---|---|---|---|
| 7,722,929 B2 | 5/2010 | Aitken et al. | |
| 7,829,147 B2 | 11/2010 | Aitken et al. | |
| 2003/0215582 A1* | 11/2003 | Bermel | 428/1.31 |
| 2008/0138653 A1 | 6/2008 | Lee et al. | |
| 2009/0068917 A1* | 3/2009 | Kim | H01L 51/56 445/25 |
| 2010/0283056 A1* | 11/2010 | Yasumatsu | 257/59 |

FOREIGN PATENT DOCUMENTS

| | | |
|---|---|---|
| KR | 10-2009-0075855 A | 7/2009 |
| KR | 10-2010-0050470 A | 5/2010 |
| WO | WO2008/045249 * | 4/2008 |

OTHER PUBLICATIONS

Chatham, H., "Review: Oxygen diffusion barrier properties of transparent oxide coatings on polymeric substrates," *Surface and Coatings Technology*, 1996, 78: 1-9.

Popovic et al., "Reliability and Degradation of Small Molecule-Based Organic Light-Emitting Devices (OLEDs)", *IEEE Journal on Selected Topics in Quantum Electronics*, 2002, 8( 2):362-371.

Forsythe, E.W., "Seminar M-5: Operation of Organic-Based Light-Emitting Devices," *Society for Information Display (SID) 40th Anniversary Seminar Lecture Notes*, vol. 1: May 20, 2002, pp. M-5/1-M-5/50, Society for Information Display, San Jose, CA.

* cited by examiner

ENCAPSULATION SHEET, METHOD OF MANUFACTURING ORGANIC LIGHT EMITTING DISPLAY DEVICE USING THE SAME, AND ORGANIC LIGHT EMITTING DISPLAY DEVICE

CROSS-REFERENCE TO RELATED APPLICATIONS

Any and all priority claims identified in the Application Data Sheet, or any correction thereto, are hereby incorporated by reference under 37 CFR 1.57. For example, this application is a divisional of and claims priority to U.S. application Ser. No. 13/779,410, filed Feb. 27, 2013 which claims priority to and the benefit of Korean Patent Application No. 10-2012-0094443, filed in the Korean Intellectual Property Office on Aug. 28, 2012, each of which is incorporated herein by reference in its entirety.

BACKGROUND

1. Field

The present described technology generally relates to an encapsulation sheet, a method of manufacturing an organic light emitting display device using the encapsulation sheet, and an organic light emitting display device.

2. Description of the Related Technology

Organic light emitting display devices may have excellent characteristics in view of a viewing angle, a contrast, a response speed, and power consumption, and are expanding their application ranges to personal portable appliances such as MP3 players or mobile phones, and televisions (TVs).

Also, since organic light emitting display devices do not require an additional light source due to a self-emissive characteristic thereof, a thickness and a weight of the organic light emitting display devices may be reduced.

However, the organic light emitting display devices may deteriorate due to infiltration of moisture, and thus, it is very important to block the infiltration of external moisture and oxygen into the organic light emitting display devices.

SUMMARY

The present embodiments provide an encapsulation sheet having excellent moisture and oxygen blocking property, a method of manufacturing an organic light emitting display device using the encapsulation sheet, and an organic light emitting display device.

Some embodiments provide an encapsulation sheet including: a carrier film; and a first sheet formed on the carrier film, wherein the first sheet includes at least one of tin fluorophosphates glass, chalcogenide glass, tellurite glass, borate glass, and phosphate glass.

In some embodiments, the encapsulation sheet may further include a second sheet between the carrier film and the first sheet, wherein the second sheet includes tungsten.

In some embodiments, a encapsulation sheet may further include a plurality of additional first sheets and a plurality of additional second sheets, where each first sheet is stacked alternately with each second sheet. In some embodiments, at least one first sheet comprises tin fluorophosphates glass and the tin fluorophosphates glass comprises tin (Sn) by 20 to 80 weight %, phosphorus (P) by 2 to 20 weight %, oxygen (O) by 3 to 20 weight %, and fluorine (F) by 10 to 36 weight %.

In some embodiments, the encapsulation sheet may further include a third sheet between the carrier film and the first sheet, wherein the third sheet may be patterned as stripes, and the third sheet may include tungsten.

In some embodiments, the first sheet includes tin fluorophosphates glass and the tin fluorophosphates glass may include tin (Sn) by 20 to 80 weight %, phosphorus (P) by 2 to 20 weight %, oxygen (O) by 3 to 20 weight %, and fluorine (F) by 10 to 36 weight %. In some embodiments, the additional first sheet includes tin fluorophosphates glass and the tin fluorophosphates glass includes tin (Sn) by 20 to 80 weight %, phosphorus (P) by 2 to 20 weight %, oxygen (O) by 3 to 20 weight %, and fluorine (F) by 10 to 36 weight %.

Some embodiments provide a method of manufacturing an organic light emitting display device, the method including: forming an organic electroluminescence unit on a substrate; locating an encapsulation sheet that includes a carrier film and a first sheet on the carrier film on the organic electroluminescence unit; forming an encapsulation layer formed of the first sheet by heating the encapsulation sheet; and separating the carrier film from the encapsulation layer, wherein the first sheet is formed of a low liquidus temperature material, and the low liquidus temperature material may include at least one of tin fluorophosphates glass, chalcogenide glass, tellurite glass, borate glass, and phosphate glass. In some embodiments, the encapsulation sheet includes tin fluorophosphates glass.

In some embodiments, the encapsulation sheet may further include a second sheet formed between the carrier film and the first sheet.

In some embodiments, the method further comprises forming a plurality of additional first sheets and a plurality of additional second sheets, where each first sheet is alternately formed on each second sheet.

In some embodiments, the second sheet may include tungsten.

In some embodiments, the low liquidus temperature material and the tungsten may react with each other when the encapsulation sheet is heated to a temperature. In some embodiments, the temperature of the heat may be 200° C. or less. In some embodiments, the temperature of the heat may be from about 150° C. to 200° C.

In some embodiments, the encapsulation sheet may further include an intermediate layer between the carrier film and the first sheet.

In some embodiments, the first sheet includes tin fluorophosphates glass and the tin fluorophosphates glass may include tin (Sn) by 20 to 80 weight %, phosphor (P) by 2 to 20 weight %, oxygen (O) by 3 to 20 weight %, and fluorine (F) by 10 to 36 weight %.

In some embodiments, a temperature of the heat applied to the encapsulation sheet may be 200° C. or less.

Some embodiments provide an organic light emitting display device including: a substrate; an organic electroluminescence unit; and an encapsulation layer sealing the organic electroluminescence unit, wherein the encapsulation layer is formed of a glass material, and the glass material includes at least one of tin fluorophosphates glass, chalcogenide glass, tellurite glass, borate glass, and phosphate glass.

In some embodiments, the encapsulation layer may further include tungsten, and the tungsten is included by 0.1 to 15 weight %.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

The present disclosure will now be described more fully hereinafter with reference to the accompanying drawings, in which illustrative embodiments are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to accompanying drawings.

Figure 1:
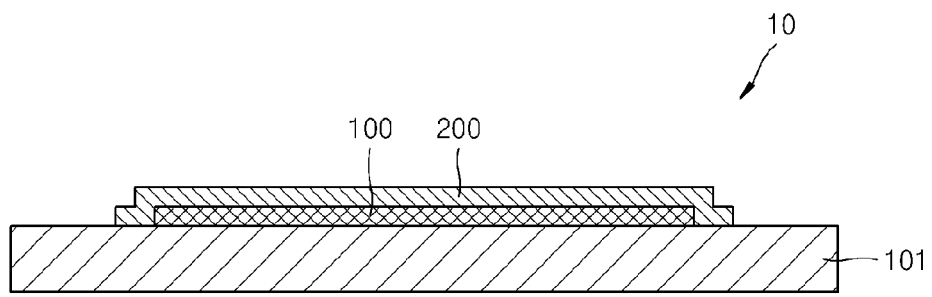
FIG. 1 is a cross-sectional view of an organic light emitting display device according to an aspect of the present embodiments.
Figure 2:
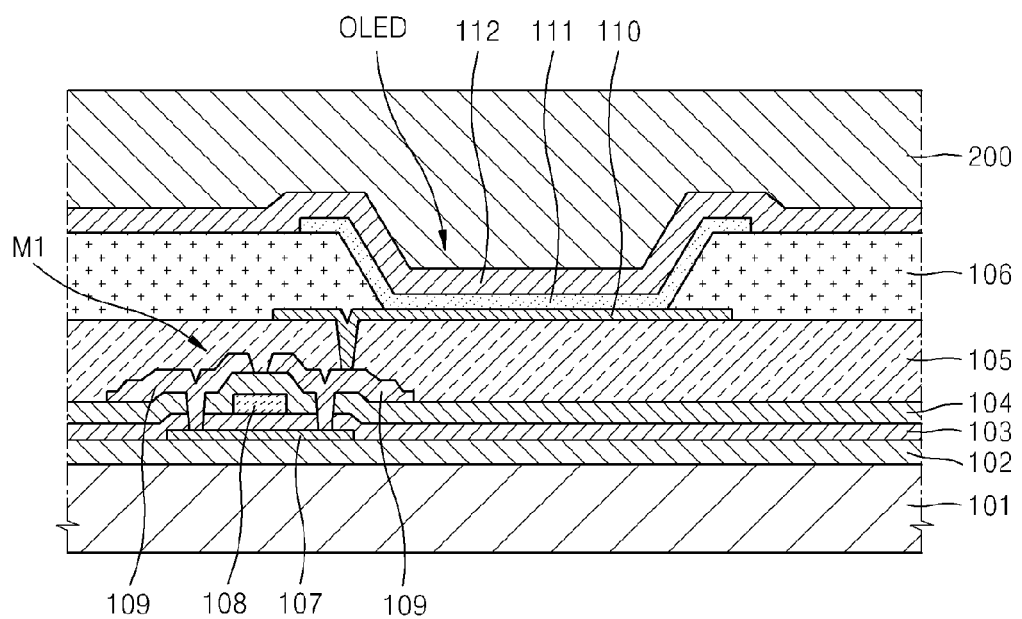
FIG. 2 is an expanded view of a portion P in FIG. 1.

FIG. 1 is a cross-sectional view of an organic light emitting display device 10 according to an embodiment, and FIG. 2 is an expanded view of a portion P shown in FIG. 1.

Referring to FIGS. 1 and 2, the organic light emitting display device 10 according to an embodiment includes a substrate 101, an organic electroluminescence unit 100 formed on the substrate 101, and an encapsulation layer 200 sealing the organic electroluminescence unit 100.

In some embodiments, the substrate 101 may be formed of a glass material, or may be formed of a plastic material such as acryl, polyimide, polycarbonate, polyester, or mylar in order to add flexibility to the organic light emitting display device 10. Also, an insulating layer 102 such as a barrier layer and/or a buffer layer for preventing impurity ions from dispersing, preventing infiltration of moisture or external air, and planarizing a surface may be formed on an upper surface of the substrate 101.

In some embodiments, the organic electroluminescence unit 100 may include a driving thin film transistor (TFT) M1 and an organic light emitting diode (OLED) formed on the substrate 101, as shown in FIG. 2. Meanwhile, FIG. 2 shows a front emission type organic electroluminescence unit 100 as an example; however, the present embodiments are not limited thereto, that is, the organic electroluminescence unit 100 may have a rear emission type structure or other various structures that are different from the configuration of FIG. 2.

In some embodiments, an active layer 107 of the driving TFT M1 may be formed of a semiconductor material, and a gate insulating layer 103 may be located to cover the active layer 107. In some embodiments, the active layer 107 may be formed of an inorganic semiconductor material such as amorphous silicon or polysilicon, or an organic semiconductor material.

In some embodiments, a gate electrode 108 may be formed on the gate insulating layer 103, and an interlayer dielectric 104 may be formed to cover the gate electrode 108. In some embodiments, source/drain electrodes 109 may be formed on the interlayer dielectric 104, and a passivation layer 105 and a pixel defining layer 106 may be sequentially formed to cove the source/drain electrodes 109.

In some embodiments, the gate electrode 108 and the source/drain electrodes 109 may be formed of metal such as Al, Mo, Au, Ag, Pt/Pd, or Cu. In some embodiments, a resin paste including the above metal as powder may be applied or a conductive polymer may be used to form the gate electrode 108 and the source/drain electrodes 109.

In some embodiments, the gate insulating layer 103, the interlayer dielectric 104, the passivation layer 105, and the pixel defining layer 106 may be formed of an insulating substance to have a single-layered or multi-layered structure, and may be formed of an organic material, an inorganic material, or a compound of the organic/inorganic materials.

In some embodiments, although not shown in FIG. 2, a switching TFT and a storage capacitor may be formed through the same processes as those of the driving TFT M1. However, the stacked structure of the driving TFT M1 is not limited to the above structure, and TFTs having various structures may be used.

In some embodiments, the OLED emits red, green, and blue light according to a flow of an electric current to display predetermined image information, and may include a pixel electrode 110 that may be connected to one of the source/drain electrodes 109 of the driving TFT M1, an opposite electrode 112 formed to cover entire pixels, and an organic emission layer 111 disposed between the pixel electrode 110 and the opposite electrode 112 to emit light.

In some embodiments, the encapsulation layer 200 may be formed to entirely cover the organic electroluminescence unit 100 to prevent external moisture and oxygen from infiltrating into the organic electroluminescence unit 100.

In some embodiments, the encapsulation layer 200 may be formed of a glass material, thereby preventing the external moisture and oxygen from infiltrating effectively. In some embodiments, the encapsulation layer 200 may be formed of a low liquidus temperature material. In some embodiments, the encapsulation layer 200 may include at least one of tin fluorophosphates glass, chalcogenide glass, tellurite glass, borate glass, and phosphate glass. In some embodiments, the encapsulation layer 200 may have an excellent moisture and oxygen blocking performance, and thus, lifespan of the organic light emitting display device 100 may be increased.

In some embodiments, the encapsulation layer 200 may further include tungsten. In some embodiments, more stabilized and uniform glass may be fabricated when tungsten is added. Thus, chemical durability of the encapsulation layer 200 may be improved.

In some embodiments, a melting point of the encapsulation layer 200 may be 200° C. or less. In some embodiments, a melting point of the encapsulation layer 200 may be from about 150° C. to 200° C. In some embodiments, damage of each of the components of the organic electroluminescence unit 100 due to the heat may be prevented, and the encapsulation layer 200 may be easily formed when heat is applied to form the encapsulation layer 200.

Figure 3:
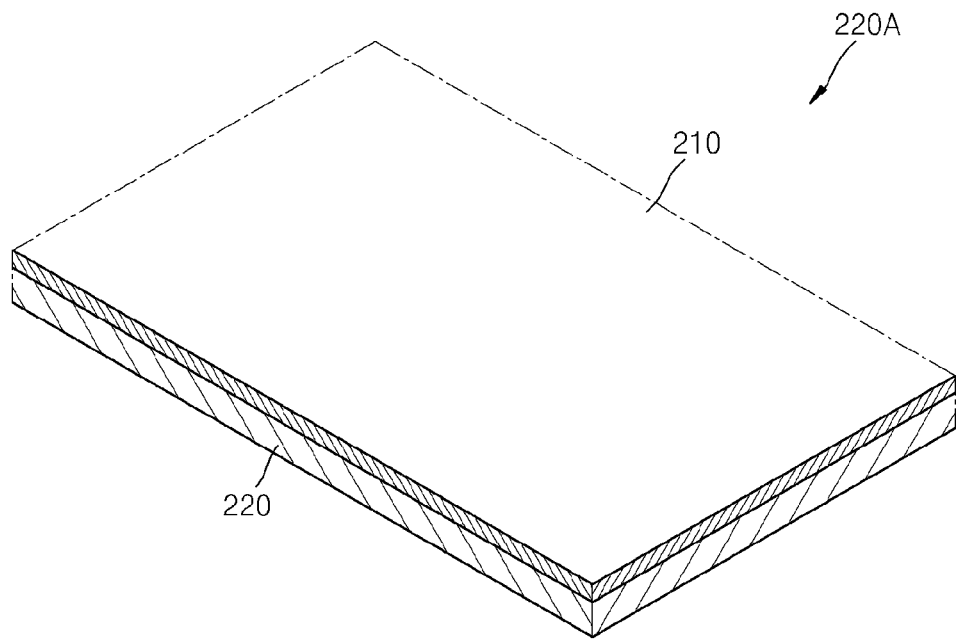
FIGS. 3 through 5 are perspective views of encapsulation sheets forming an encapsulation layer of FIG. 1.
Figure 4:
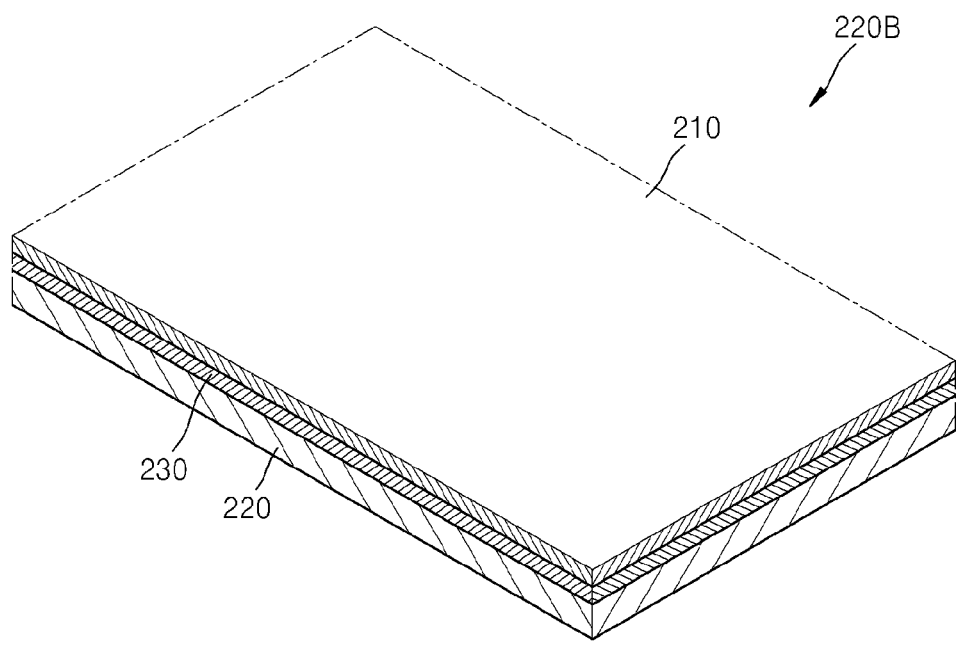
Figure 5:
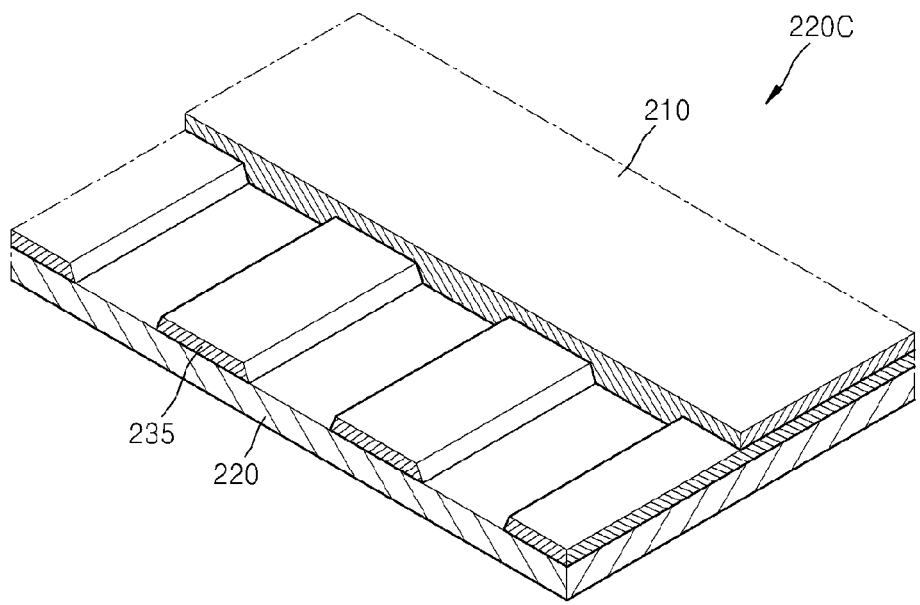

FIGS. 3 through 5 are perspective views showing encapsulation sheets forming the encapsulation layer 200 of FIG. 1.

Referring to FIG. 3, an encapsulation sheet 200A may include a carrier film 210 and a first sheet 220 formed on a surface of the carrier film 210.

In some embodiments, the carrier film 210 may be formed of one selected from the group consisting of polyethylene terephthalate, polyester, polyacryl, polyepoxy, polyethylene, and polystyrene that have excellent thermal stability and mechanical stability, or may be formed of a glass material.

In some embodiments, the first sheet 220 may be formed of a low liquidus temperature material, for example, at least one of tin fluorophosphates glass, chalcogenide glass, tellurite glass, borate glass, and phosphate glass. For example, the tin fluorophosphates glass may include tin (Sn) by 20 to 80 weight %, phosphorus (P) by 2 to 20 weight %, oxygen (O) by 3 to 20 weight %, and fluorine (F) by 10 to 36 weight %.

In some embodiments, the first sheet 220 may be formed by forming a film of a low liquidus temperature material on the carrier film 210 by using a deposition method, a vapor deposition method, a coating method, a spin-coating method, a sputtering method, a rolling method, or a laser ablation method.

Although not shown in FIG. 3, an intermediate layer (not shown) may be further formed between the carrier film 210 and the first sheet 220. In some embodiments, the intermediate layer (not shown) may make the encapsulation layer 200 (refer to FIG. 1) separate easily from the carrier film 210 when the encapsulation layer 200 is formed of the first sheet 220.

In some embodiments, an encapsulation sheet 200B of FIG. 4 further includes a second sheet 230 between the first sheet 220 and the carrier film 210. In some embodiments, the second sheet 230 may be a layer including tungsten, for example, the second sheet 230 may include $H_2WO_3$, or $WO_3$.

As described above, if the second sheet 230 is further formed, when heat is applied to the encapsulation sheet 200B to form the encapsulation layer 200 (refer to FIG. 1), the low liquidus temperature material and the tungsten react with each other to form stable and uniform glass. In some embodiments, the reaction between the low liquidus temperature material and the tungsten may be a diffusion reaction. Accordingly, the chemical durability of the encapsulation layer 200 (refer to FIG. 1) may be further improved.

In some embodiments, a plurality of first sheets 220 and a plurality of second sheets 230 may be stacked, and the plurality of first sheets 220 and the plurality of second sheets 230 may be stacked alternately with each other in order to improve the reactivity. In some embodiments, the tungsten included in the encapsulation layer 200 (refer to FIG. 1) may be about 0.1 to 15 weight % due to the reaction with the low liquidus temperature material.

In some embodiments, an encapsulation sheet 200C shown in FIG. 5 may further include a third sheet 235 between the first sheet 220 and the carrier film 210. In some embodiments, the third sheet 235 may be formed of the same material as that of the second sheet 230 shown in FIG. 4. In some embodiments, the third sheet 235 may be patterned on the carrier film 210. For example, the third sheet 235 may be formed on the carrier film 210 as stripe patterns; however, the present embodiment is not limited thereto. In some embodiments, the third sheet 235 may be formed as dots or grating patterns.

In some embodiments, the low liquidus temperature material of the first sheet 220 and the tungsten in the third sheet 235 may react with each other to form stable and uniform glass when heating the encapsulation sheet 200C for forming the encapsulation layer 200 (refer to FIG. 1). In some embodiments, the above reaction may be a diffusion reaction. In some embodiments, the third sheet 235 may be patterned on the carrier film 210, and therefor the amount of tungsten included in the encapsulation layer 200 (refer to FIG. 1) may be easily adjusted.

Figure 6:
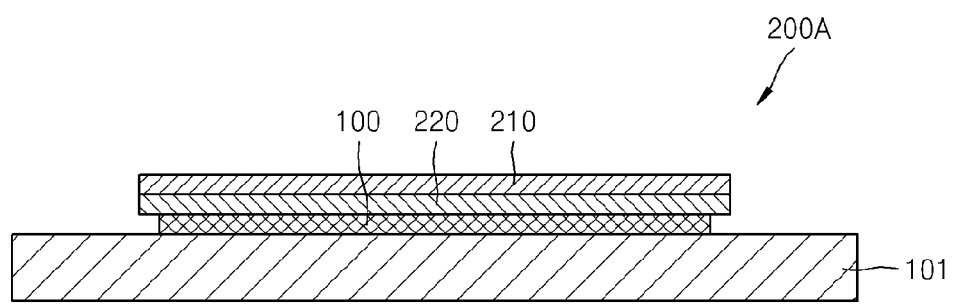
FIGS. 6 through 8 are cross-sectional views illustrating a method of manufacturing the organic light emitting display device of FIG. 1.
Figure 7:
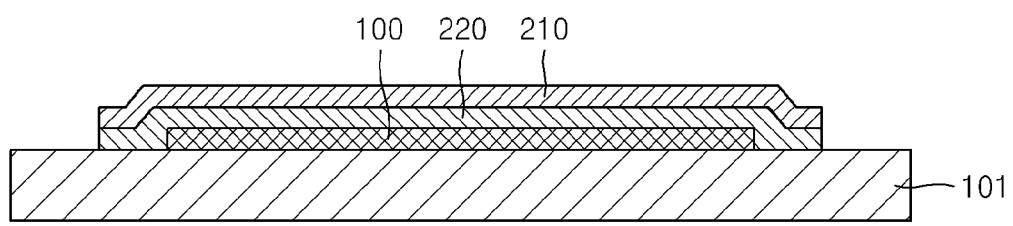
Figure 8:
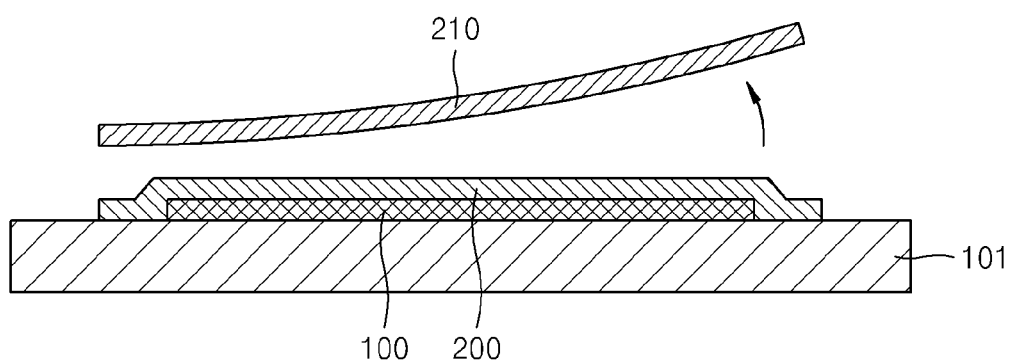

FIGS. 6 through 8 are cross-sectional views illustrating a method of manufacturing the organic light emitting display device of FIG. 1.

Referring to FIGS. 6 through 8, the organic electroluminescence unit 100 may be formed on the substrate 101 as shown in FIG. 6, and then, the encapsulation sheet 200A may be located on the organic electroluminescence unit 100.

In some embodiments, the organic electroluminescence unit 100 may have the structure shown in FIG. 2. In some embodiments, the organic electroluminescence may have various structures that are well known in the art.

In some embodiments, the encapsulation sheet 200A in which the carrier film 100 faces upward is located on the organic electroluminescence unit 100.

In some embodiments, the, the encapsulation sheet 200A may be melted to contact upper and side surfaces of the organic electroluminescence unit 100 and a partial upper surface of the substrate 101 when the encapsulation sheet 200A is heated, as shown in FIG. 5.

In some embodiments, the first sheet 220 may be formed of the low liquidus temperature material such as tin fluorophosphates glass, chalcogenide glass, tellurite glass, borate glass, and phosphate glass, and therefore the melting point of the first sheet 220 is 200° C. or less. In some embodiments, a melting point of the first sheet 220 may be from about 150° C. to 200° C. Therefore, the first sheet 220 may be melted to form the encapsulation layer 200 (refer to FIG. 8) without damaging each of the components in the organic electroluminescence unit 100 due to the heat.

Next, as shown in FIG. 8, after forming the encapsulation layer 200 by melting the first sheet 220, the carrier film 210 may be separated to be removed. In some embodiments, the carrier film 210 may be removed in a physical manner.

FIGS. 6 through 8 show an embodiment where the encapsulation layer 200 may be formed by using the encapsulation sheet 200A shown in FIG. 3. In some embodiments, the encapsulation layer 200 may be formed by using the encapsulation sheet 200B of FIG. 4 or the encapsulation sheet 200C of FIG. 5.

In some embodiments, where the encapsulation sheets 200B and 200C shown in FIGS. 4 and 5 respectively include the second sheet 230 and the third sheet 235, each including the tungsten, the encapsulation layer 200 formed by using the encapsulation sheet 200B of FIG. 4 or the encapsulation sheet 200C of FIG. 5 may include more stabilized and uniform glass. Thus, the chemical durability of the encapsulation layer 200 may be further improved.

In some embodiments, the encapsulation layer may be formed by using the glass material having excellent moisture and oxygen blocking property, and thus, lifespan of the organic light emitting display device may be increased.

While the embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An encapsulation sheet, comprising:
a carrier film; and
a first sheet formed over the carrier film,
a second sheet between the carrier film and the first sheet, wherein the second sheet comprises tungsten, and wherein the first sheet comprises at least one of chalcogenide glass, tellurite glass, borate glass, and phosphate glass, and
wherein the first sheet is separable from the carrier film.

2. The encapsulation sheet of claim 1 wherein the second sheet is patterned.

3. An encapsulation sheet, comprising:
a carrier film;
a first sheet formed over the carrier film,
the first is separable from the carrier film, and the first sheet comprising at least one of tin fluorophosphates glass, chalcogenide glass, tellurite glass, borate glass, and phosphate glass; and
a second sheet formed between the carrier film and the first sheet, the second sheet patterned as stripes, and the second sheet formed of tungsten.

4. The encapsulation sheet of claim 3, wherein the first sheet comprises tin fluorophosphates glass and the tin fluorophosphates glass comprises tin (Sn) by 20 to 80 weight %, phosphorus (P) by 2 to 20 weight %, oxygen (O) by 3 to 20 weight %, and fluorine (F) by 10 to 36 weight %.

* * * * *